United States Patent
Josefowicz

Patent Number: 6,048,584
Date of Patent: Apr. 11, 2000

[54] APPARATUS AND METHOD FOR COATING MULTILAYER ARTICLE

[75] Inventor: Jack Y. Josefowicz, Westlake Village, Calif.

[73] Assignee: Tyco Printed Circuit Group, Inc., Statford Springs, Conn.

[21] Appl. No.: 09/076,801

[22] Filed: May 13, 1998

[51] Int. Cl.[7] ........................................ B05D 1/18
[52] U.S. Cl. .................. 427/436; 427/97; 427/98; 427/430.1; 427/443.2
[58] Field of Search ........................... 427/98, 192, 299, 427/430.1, 443.2, 436, 97; 118/410, 429; 205/98, 131, 118, 133, 150, 161, 125, 126, 148, 920

[56] References Cited

U.S. PATENT DOCUMENTS

| | | |
|---|---|---|
| 4,418,641 | 12/1983 | Nakashima et al. ............... 118/429 |
| 4,734,296 | 3/1988 | Schramm ............................ 427/97 |
| 4,875,982 | 10/1989 | Velie . |
| 4,883,571 | 11/1989 | Kondo et al. . |
| 4,891,069 | 1/1990 | Holtzman et al. . |
| 4,933,049 | 6/1990 | Murphy et al. ..................... 204/15 |
| 5,545,429 | 8/1996 | Booth et al. ....................... 427/97 |

*Primary Examiner*—Shrive Beck
*Assistant Examiner*—Michael Barr
*Attorney, Agent, or Firm*—W. Warren Taltavull; Farkas & Manelli PLLC

[57] ABSTRACT

A method and apparatus of applying a coating to an article having one or more recesses or through holes includes establishing in a bath of coating solution a substantially uniform velocity flow field over and generally parallel to the surface of the article so as to create a pressure differential between the liquid flowing over the surface and the liquid present in the hole or recess.

14 Claims, 3 Drawing Sheets

APPARATUS AND METHOD FOR COATING MULTILAYER ARTICLE

FIELD OF THE INVENTION

The present invention relates to an improved apparatus and method for applying a coating to a surface and, more particularly, to a surface having features that are frequently difficult or time-consuming to effectively coat.

BACKGROUND OF THE INVENTION

In a wide range of industrial processes, it is frequently necessary to apply a coating to an article. In some cases, where the coating serves as a protective barrier, uniformity of the coating is of paramount importance. In many electrical devices, the application of a conductive layer also requires the appropriate density or thickness minimums be met as well as uniformity in the coating of the surface such as a printed circuit board as any non-uniformity can lead to a failure in the circuit and a complete elimination of the article as they are typically not salvageable or repairable at a reasonable cost. Thus, while a coating in an electrically conductive device need not be highly uniform it is required that in the intended patterns the coating be continuous to assure a closed circuit.

Where the surface or surfaces to be coated have unusual geometries, the prior art has attempted a variety of techniques to achieve the desired uniformity of the coating as well as continuity of the coating over the required portions of the article. While some of these methods have had limited success, with the increasingly complex geometries encountered, the prior art techniques have not been able to achieve a high degree of uniformity at a reasonable cost both in terms of the time required to effect coating as well as the expense of the techniques employed.

In a specific coating application involving multi-layer printed circuit boards, through holes having a high aspect ratio are required to enable the inter-leaved circuit layers to be connected together. In more recent designs, the number of layers employed has been increasing to enable greater capacity and/or complexity in terms of the operations of the equipment that will incorporate the board. It has been recognized that the improved uniformity of the coating in the through holes in these types of applications presents a significant obstacle to increased production efficiency and capacity in view of the great amount of time required in conventional electroplating systems to effect uniform coating of the surfaces of the through holes.

In an attempt to solve this difficulty, the prior art such as is represented by U.S. Pat. No. 4,875,982, granted Oct. 24, 1989, has proposed a time-consuming and, therefore expensive, technique of specifically addressing each hole formed in a board for the purpose of improving flow through the hole of a solution including a plating element such as copper ions in a copper sulfate bath. Other iS attempts have been directed to electrochemical reactions but these require a pre-coating of the board with an agent that will effectively react with a solution containing a metal to be deposited. In this regard, reference may be had to U.S. Pat. No. 4,891,069, granted Jan. 2nd, 1990. Reverse electric pulse plating has been employed where the electric current is alternated for selected intervals. This has improved the plating process generally but has not proven particularly useful with through or blind holes in boards.

SUMMARY OF THE INVENTION

The present invention avoids the difficulties of the prior art techniques and provides a method for economically coating surfaces including surfaces having complex geometries in a shorter time interval than has previously been possible. In one embodiment, where the article to be coated is formed with one or more through holes having a high aspect ratio and where it is necessary to coat the interior surface of the through holes substantially uniformly, according to the present invention, a flow of substantially uniform velocity of a coating solution is set up in a bath in which the article to be coated is immersed with the velocity vector of the flow directed substantially parallel to the surface of the article in the area where the through hole is located. Preferably, the fluid flow will be continuous about the article to provide a substantially continuous fluid pressure field. By continuous is meant that the field has no significant interruptions and to this end, the article is preferably substantially planar although small deviations from a plane can be tolerated. The continuity in the flow will enhance uniformity in the coating and avoid localized accumulations of the coating material. With such an arrangement, a non-uniformity in the surface of the article that is in the form of a recess or through hole in the surface will create a pressure variation that has been discovered to be generally favorable to uniform deposition coating in the recess or hole particularly with electroplating methods due to the increased mass transfer that is provided in the recess or hole.

The present invention has been found to be particularly useful in the application of a conductive metal to a substrate such as a printed circuit board which may comprise layers that are inter-leaved to provide alternating conductive and non-conducting layers in the board. In some constructions, the board is provided with recesses that may extend across several layers and the board may also be provided in addition or in the alternative with through holes as described above. To conserve space, the through holes generally have a very high aspect ratio on the order of 6:1 but may be as high as 20:1. With the flow in the coating bath established as described above, relatively elevated pressure will be developed within each hole while, on either end of each through hole, relatively lower pressure will prevail as a result of the velocity of flow of the liquid. Under these conditions, circulation into and out of the hole will be induced and the fluid that is present in the hole will be forced outwardly under the influence of the pressure differential existing. This assures a continuous flow of fresh coating solution to the interior of each through hole. Even where a closed end recess is provided in the surface of a board, a pressure differential will be set up as flow is established over the mouth of the recess causing the fluid in the recess to assume a vortex configuration which will effectively carry fresh solution to the side wall of the recess to thereby effect uniform coating of the side wall.

In a specific form of the invention, a number of fluid spargers are employed on opposite sides of an article to establish a substantially uniform flow field with directed movement or motion over the surface of the article immersed in a bath of coating solution. It has been found that the fluid velocity to achieve useful coating should be no less than 0.5 cm/sec but need be no greater than about 100 cm/sec. The deposition of the metal ions can be effected through application of an electrical potential difference or by a chemical reaction or both of these techniques as they rely on the magnitude of the mass transfer of solution into and through the hole to be effective. In either case, the ion concentration will be sufficient in the hole or in a recess where the fluid flow over the mouth of a formation is achieved and maintained until a coating of sufficient depth is provided.

BRIEF DESCRIPTION OF THE DRAWINGS

Details of the method of the present invention will become apparent as consideration is given to the following detailed description taken in conjunction with the accompanying drawings, in which.

DETAILED DESCRIPTION OF THE INVENTION

Figure 1:
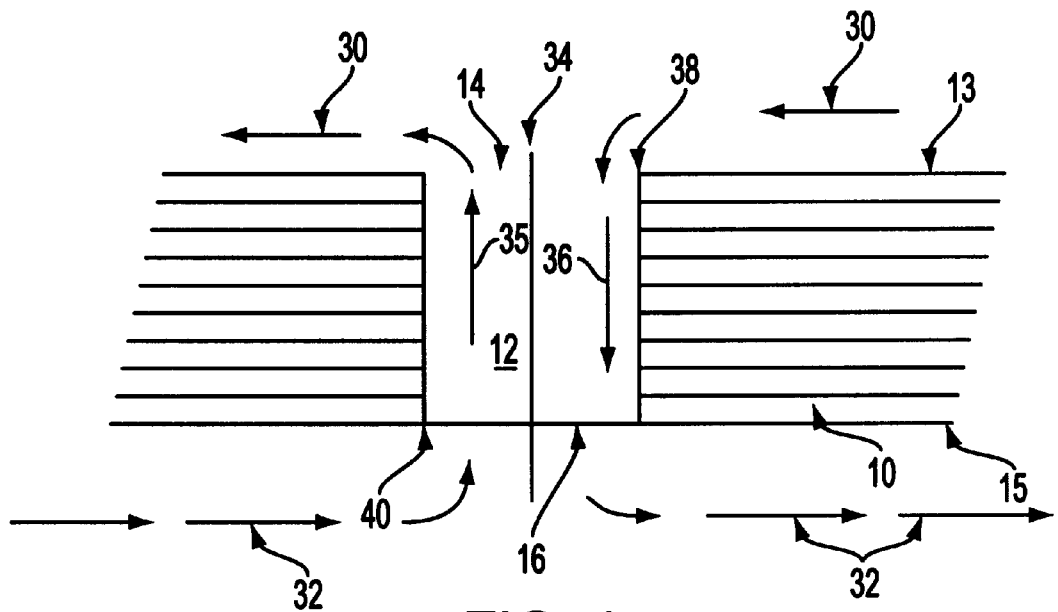
FIG. 1 is a sectional view in elevation of a portion of a printed circuit board in which is formed a through hole.

Referring now to the drawings wherein like numerals designate corresponding parts throughout the several views, there is shown in FIG. 1 a sectional view of a portion of a printed circuit board 10 through which has been formed a hole 12 having openings or mouths 14 and 16 at opposite ends of the hole. In multi-layer boards, the circuit of one layer is typically connected to the circuit of one or more of the other layers in the board. As is well known, this is effected by forming pads or circular areas of metal at points on the conductive line or lines of the layers. The points may also be isolated from the conductive lines in some designs. The other layers of the board that are to be connected are similarly provided with pads such as in a lamination process which pads of the different boards are aligned over one another.

After pressing the layers to form the board, the board is drilled to form the through holes such as is illustrated at 12 and FIG. 1. Typically, the diameter of the drill is substantially less than the diameter of a pad. In a conventional design of a multi-layer board, conductive layers will be interspersed with non-conductive layers so that it is then necessary to connect the conductive layers. This is achieved by providing first an electroless copper layer on the wall of the hole followed by an electroplated conductive connector in the holes 12 to form the desired electrical connection between the pads on each layer. The electroplating is accomplished using a bath of a solution that includes a source of conductive ions such as copper sulfate. Providing an effective coating on the wall of a through hole, in the commercial aspect ratio range, to a depth of about 25 microns has taken more than one hour up to ninety minutes with the available electroplating direct current plating and air sparging techniques even where there has been agitation of the solution.

It has been found that where a directed velocity fluid flow is used to produce uniform flow of plating solution over the surface of the holes, a pressure differential is established between fluid in the hole and the fluid on the surface of an article such as a board. The presence of the differential is utilized to increase the mass transfer flow of the coating solution relative to a specific portion of the surface over which the fluid flow has been established. As previously noted, the parameters of the fluid flow are also important. For example, the velocity of the flow is preferably between 0.5 cm/sec and 100 cm/sec. Factors influencing the selection of the velocity of the fluid flow will include the surface area to be covered by the flow, the type of interaction that is desired between the coating solution and the surface of the article and the energy required in establishing the fluid flow. The depth of the fluid flow will normally range, according to the present invention, from 0 cm to about 30 cm measured perpendicularly above the surface of the article.

Referring again to FIG. 1, as shown, the hole 12 is substantially cylindrical in shape. This is normally achievable by drilling but other means may be used. For example, the individual layers may be preformed so that when bonded together the cylindrical holes will be defined. Other passage shapes may also be developed and the invention is not limited to cylindrical apertures. With the desired configuration of holes 12 formed in the boards, the boards will typically be cleaned in an acid bath to improve the adherence of the subsequently applied plating solution.

Figure 2:
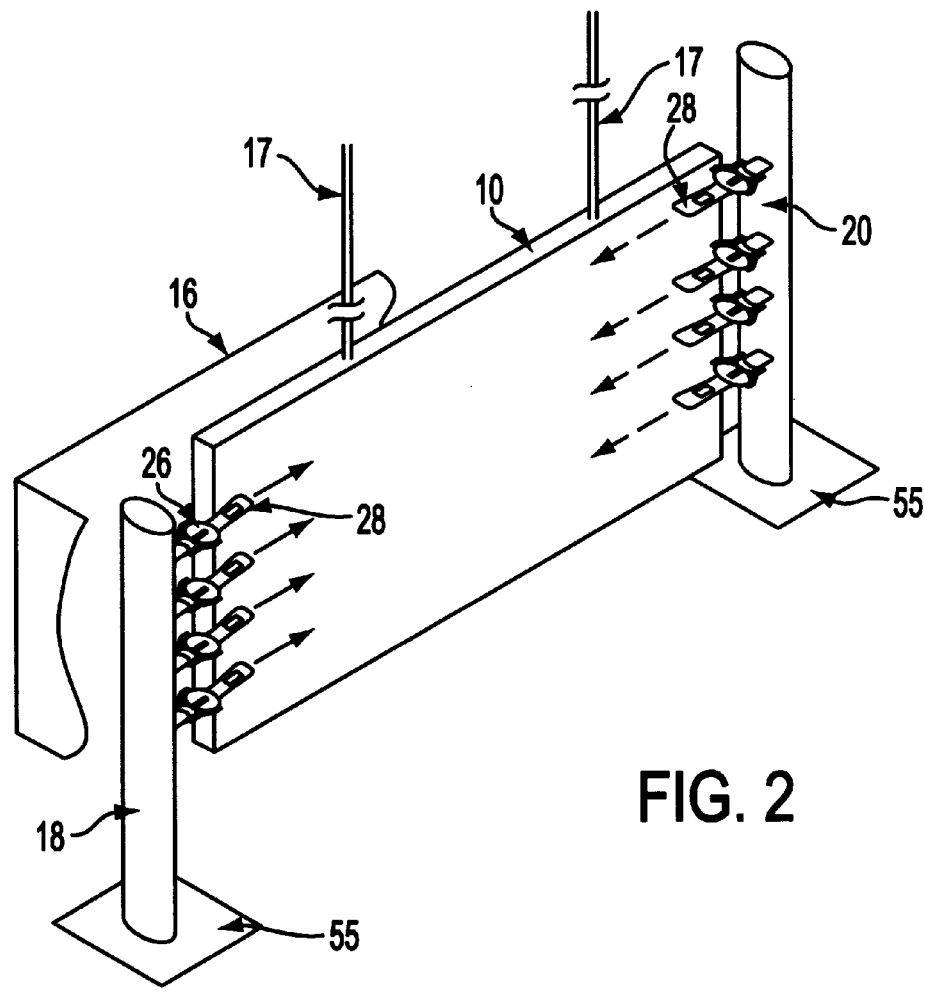
FIG. 2 is a schematic perspective illustration of an embodiment of an installation useful in carrying out the method of the present invention.
Figure 3:
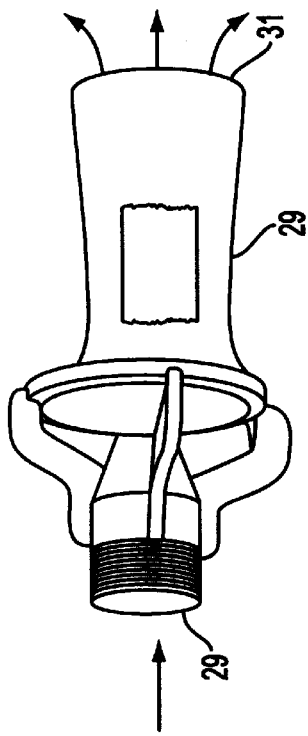
FIG. 3 is a top plan view of the installation of FIG. 2.

One method of establishing the desired flow conditions about the board 10 is shown in FIGS. 2 and 3. As shown, a board 10 is preferably vertically suspended by clamps 17 supported on stiff racks (not shown) in a tank 16 which is filled with the desired solution such as a liquid containing $CuSO_4$. While the illustrated board surfaces are planar and rectangular in configuration, it will be understood by those skilled in this technology that the invention is not limited to the shape or planar condition of the board. However, to simplify the illustration and description, a planar board 10 is illustrated. Two conduits 18 and 20 extend substantially vertically from the floor of the tank 16 and are offset a distance from the adjacent edges 22 and 24 of the board 10 so as not to interfere with the fluid flow once it is established. The conduits 18 and 20 will be connected to an external pump indicated schematically at 55. Each of the conduits 18 and 20 are provided with four spaced apart threaded outlet nipples, one of which is indicated at 26. On each of the nipples 26 an eductor nozzle 28 is connected in a manner to direct the output of a nozzle in a direction substantially parallel to the adjacent surface of the board. The conduits 18 and 20 are preferably disposed to extend parallel to the surfaces 13, 15 of the board 10 to minimize flow disturbances. Other dispositions of the conduits will be apparent to those skilled in this art. It will be noted from FIG. 3 that the nozzles extending from conduit 18 direct fluid flow in one direction relative to the board while the nozzles 28 supported on the conduit 20 direct the fluid flow in a direction opposite to that of the nozzles mounted on the pipe 18. This will achieve substantially equal velocity flow fields over each planar surface of the board.

Figure 5:
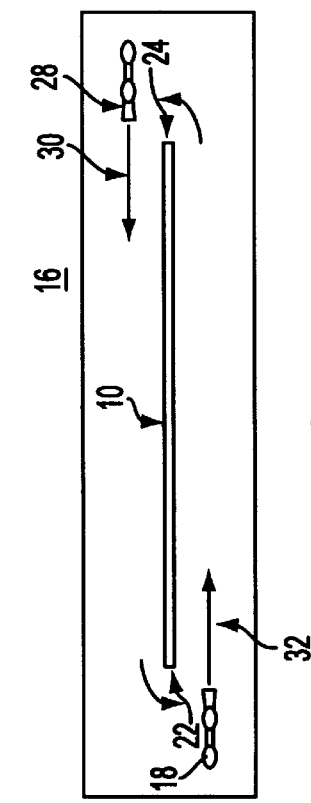
FIG. 5 is a detailed view of an eductor device useful with the method of present invention.

As shown in FIG. 5, the nozzles 28 are of the eductor type which are commercially available from Serfilco, Ltd. The configuration of the nozzles provides a superior pumping action in that liquid in the bath is drawn in the rear portion 29 of the nozzle so that for each gallon of pressure liquid supplied from the conduit 18 and delivered to a nozzle 28, 4 gallons is recirculated from the bath from the delivery end 31 of the nozzle. With this arrangement, a continuous fluid flow as shown in FIG. 3 about the board 10 will be achieved when operating conditions have been attained. The spacing of the nozzles 28 along the supply conduit 18 and 20 should be substantially identical and of a size to give a substantially uniform fluid flow about the board 10 in the direction of the arrows. With different shapes and surfaces on the article to be coated, some experimentation in the location and spacing of the nozzles will be required to achieve and maintain a uniform fluid flow of uniform velocity about the articles to be coated.

Referring again to FIG. 1, the flow over surface 13 of the board is in the direction of the arrows 30 while, on the opposite face 15 of the board 10, the flow is in the opposite direction as indicated by the arrows 32. In accordance with the principles of standard hydrodynamics, fluid flow over an opening 14 and 16 of a hole 12 will be at a relatively lower pressure than the fluid in the hole 12. As a consequence, according the invention, as viewed in FIG. 1, liquid on the left side of the center line 34 of the hole 12 will tend to flow outwardly as viewed in FIG. 1 towards the flow stream 30 from the flow stream 32 while liquid on the right side of the center line 34 of the hole 12 will tend to move downwardly in the direction of arrow 36 toward and into the fluid flow stream 32. This characteristic will significantly enhance the mass transfer operation in the hole 12 to thereby enhance the deposition uniformity where the exposed conductive material of a layer is maintained at a negative potential and the solution is maintained in a neutral condition. Improved uniformity of a coating will also be enhanced without use of a potential difference between the solution and the layers or surface being treated by virtue of the circulation created in the hole 12. Further, excess accumulation of deposits adjacent the surfaces 14 and 16 will be avoided by virtue of the multi-flow direction about the edges 38 and 40 of the faces 14 and 16 of the hole 12.

In a blind recess, that is, where, for example, the face 16 of hole 12 is closed, the flow paths 35 and 36 will likely still exist and a vortex flow can also be generated in the hole 12 which also will assist in ion deposition on the side wall of the hole 12. It is expected that the magnitude of the flow vectors along paths 35 and 36 in a blind recess will be reduced relative to the vectors present in an open-ended hole.

Figure 6:
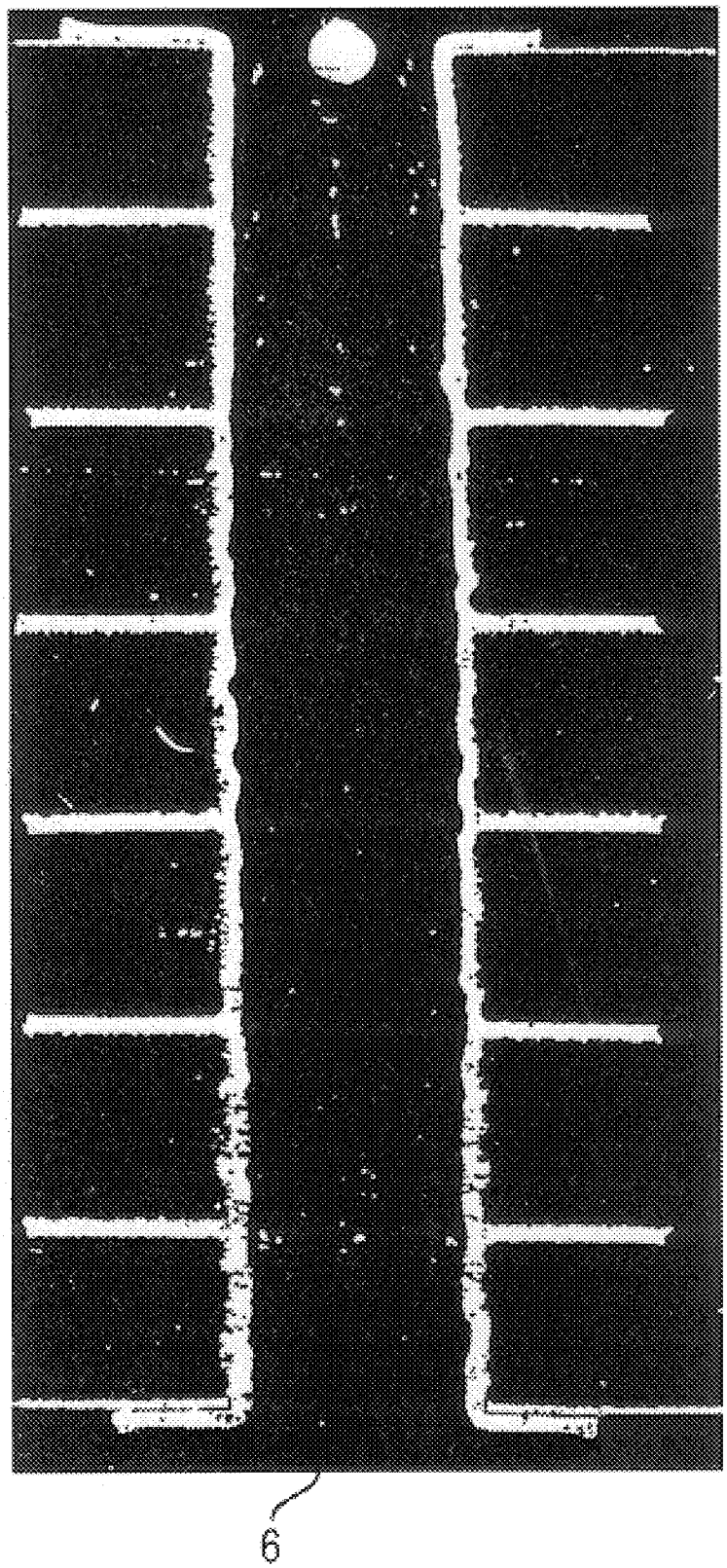
FIG. 6 is an illustration of the coating results obtained using the present invention.

In FIG. 6, there is shown a sectional view of the results of a plating performance of a through hole of a board by the technique of the present invention at approximately ×100 magnification. The ratio of the thickness of the coating on the surface of the board to the thickness at the center of the bore 15 is 1:1. Also, it will be noted that along the bore 15, the thickness of the coating is substantially well defined and without any discontinuities.

Figure 4:
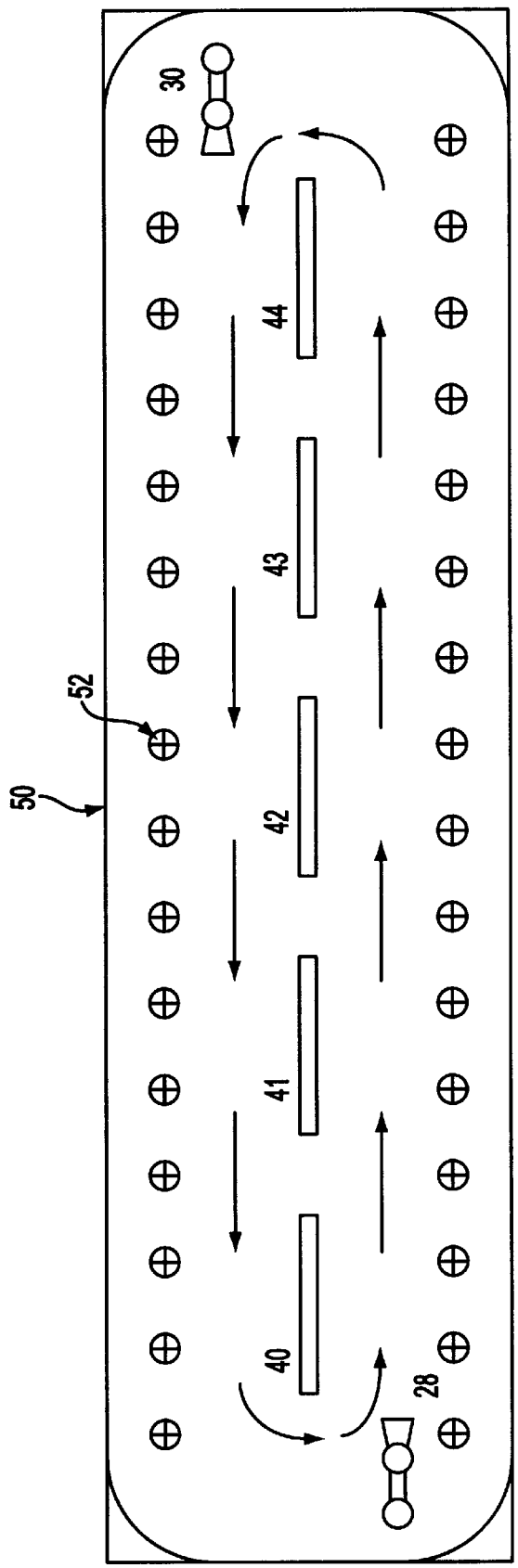
FIG. 4 is a modified form of the invention of FIGS. 2 and 3.

The method of the present invention readily lends itself to mass production as will be apparent from a consideration of the schematic view of FIG. 4 where a plurality of the boards 40–44 are suspended for immersion in a tank 50 and where similar arrays of nozzles 28, 30 are provided to induce uniform, directed flow in a continuous fashion about the suspended boards 40–44. A plurality of conductors 52 may be provided about the interior of the wall 50 or in any other position that is convenient while a circuit will contact the conductive portions of the boards 40 through 44 to render the boards cathodic. The method of the present invention will assure much greater efficiency in transporting the plating solution over all surfaces of each of the boards to be plated in a manner. This is achieved by virtue of having the flows on opposite faces of each board being directed in opposite directions.

Having described the best mode of carrying out the invention, it will be appreciated by those skilled in this art that various modifications may be made therein without departing from the scope of the claims.

What is claimed is:

1. A method of applying a coating to an article of the type having at least one recess in a surface thereof and using a bath of liquid including ions of the coating material, comprising the steps of:

a. conditioning the article so that at least a portion of the surface thereof including the recess is receptive of the ions of the coating material, b. immersing the article in the bath of the liquid, c. establishing a substantially continuous fluid flow in the bath of the liquid over the article including the surface having the recess with the flow being substantially continuous in a selected flow direction about the article and having a velocity relative to the at least one recess so as to create a fluid pressure differential between the fluid in the recess and the fluid flow over the article, said article having two oppositely facing surfaces and said recess being a bore extending from one of the surfaces through the article to the oppositely facing surface and the step of establishing a continuous flow in the bath of the liquid over the article including establishing in the bath a flow direction that is substantially continuous on both of said surfaces and about the article.

2. The method of claim 1 including the step of maintaining the velocity of the flow substantially uniform.

3. The method of claim 2 wherein the article has oppositely facing surfaces and including the step of establishing substantially equal velocity flow fields over said surfaces.

4. The method of claim 1 wherein the pressure of the liquid in the fluid flow over the article is less than the fluid pressure of a unit of volume in the recess.

5. The method of claim 1 including the step of using pumping means to establish the flow.

6. The method of claim 2 including the step of directing the flow over said one of the surfaces in one direction and over said oppositely facing surface in a direction generally opposite to said one direction.

7. The method of claim 1 wherein the article is a circuit board having at least one layer of conductive material included in said board, said board having a surface on which is formed a circuit pattern and the liquid includes a conductive metal.

8. The method of claim 2 wherein the article is a circuit board having said oppositely facing surfaces, at least one layer of conductive material included in said board, said board having on at least one of said surfaces a circuit pattern formed thereon and the liquid includes a conductive metal.

9. The method of claim 1 including the step of using, to establish the flow, at least one array of nozzles with each connected to pumping means with said nozzles of said one array spaced apart a selected distance along an axis that extends substantially parallel to the surface of the article.

10. The method of claim 1 including the step of immersing a plurality of similar articles in the bath for application of a coating to each of the articles.

11. The method of claim 3 including the step of using two spaced apart sets of nozzles located on opposite sides of the article to establish the fluid flow about the article.

12. The method of claim 11 wherein each set of nozzles is connected to a common conduit with said conduits being connected to a pump.

13. The method of claim 1 wherein said bath includes $CuSO_4$.

14. The method of claim 1 wherein the article is a circuit board including at least one layer of conductive material.

* * * * *